(12) United States Patent
Meckel

(10) Patent No.: US 8,084,089 B2
(45) Date of Patent: Dec. 27, 2011

(54) WEAR RESISTANT COATING FOR BRAKE DISKS WITH UNIQUE SURFACE APPEARANCE AND METHOD FOR COATING

(75) Inventor: Nathan K. Meckel, Escondido, CA (US)

(73) Assignee: Tech M3, Inc., Vista, CA (US)

( * ) Notice: Subject to any disclaimer, the term of this patent is extended or adjusted under 35 U.S.C. 154(b) by 510 days.

(21) Appl. No.: 12/034,590

(22) Filed: Feb. 20, 2008

(65) Prior Publication Data
US 2008/0196985 A1    Aug. 21, 2008

Related U.S. Application Data

(60) Provisional application No. 60/890,790, filed on Feb. 20, 2007.

(51) Int. Cl.
*C23C 16/00* (2006.01)

(52) U.S. Cl. .................. 427/255.7

(58) Field of Classification Search ..... 427/248.1–255.7
See application file for complete search history.

(56) References Cited

U.S. PATENT DOCUMENTS

| | | | |
|---|---|---|---|
| 2,753,808 A | 7/1956 | Kluge | |
| 3,171,527 A | 3/1965 | Josef | |
| 3,314,509 A | 4/1967 | Pelikan | |
| 3,443,454 A | 5/1969 | Hall | |
| 3,899,054 A | 8/1975 | Huntress et al. | |
| 3,993,415 A | 11/1976 | Hauser | |
| 4,180,622 A * | 12/1979 | Burkhard et al. | 428/564 |
| 4,555,239 A | 11/1985 | Miranti, Jr. | |
| 5,501,306 A | 3/1996 | Martino | |
| 5,725,913 A | 3/1998 | Wong et al. | |
| 5,838,522 A * | 11/1998 | Komvopoulos et al. | 360/122 |
| 5,861,203 A | 1/1999 | Yuan et al. | |
| 5,901,818 A * | 5/1999 | Martino | 188/218 XL |

(Continued)

FOREIGN PATENT DOCUMENTS

DE    538507 C    11/1931

(Continued)

OTHER PUBLICATIONS

Tritt, Terry M.' "Thermal Conductivity: Theory, Properties and Applications", p. 100, 2004 Kluwer Academic / Plenum Publishers.*

(Continued)

*Primary Examiner* — Michael Cleveland
*Assistant Examiner* — Michael G Miller
(74) *Attorney, Agent, or Firm* — Mintz, Levin, Cohn, Ferris, Glovsky and Popeo, P.C.

(57) ABSTRACT

A brake disk including carbon steel, stainless steel or a ceramic composite material and coated with a coating material that is wear and corrosion resistant and when applied properly allows for the coated surface to have a variety of "textured" appearances. For example; the coated surface can be made to look like woven carbon fiber. The aesthetically pleasing, wear and corrosion resistant coating overlays wear surfaces and portions of the brake disk that will be, in many cases, visible when the brake disk is installed on the vehicle. The coating includes a first layer of a metal, such as a pure titanium metal, and a second layer that can include a Nitride, Boride, Carbide or Oxide of the metal used in the first layer. The coating can be applied using a physical vapor deposition source such as a cathodic arc source with a controlled gas atmosphere.

26 Claims, 4 Drawing Sheets

U.S. PATENT DOCUMENTS

| | | | |
|---|---|---|---|
| 5,922,452 A * | 7/1999 | Takahashi et al. | 428/323 |
| 6,119,828 A | 9/2000 | Parsons | |
| 6,536,564 B1 | 3/2003 | Garfinkel et al. | |
| 7,246,586 B2 | 7/2007 | Hosenfeldt et al. | |
| 2002/0153213 A1 | 10/2002 | Gruber et al. | |
| 2003/0136614 A1 | 7/2003 | Feldmann et al. | |
| 2005/0087406 A1 * | 4/2005 | Meckel | 188/71.1 |

FOREIGN PATENT DOCUMENTS

| | | |
|---|---|---|
| EP | 1256739 A2 | 11/2002 |
| FR | 788671 A | 10/1935 |
| FR | 2807484 A1 | 10/2001 |
| JP | 63-026210 | 2/1988 |
| JP | 63-026210 A | 2/1988 |
| JP | 02-175859 A | 7/1990 |
| JP | 02-175859 A | 7/1990 |
| JP | 07-208520 | 8/1995 |
| JP | 07-208520 A | 8/1995 |
| JP | 07224390 A | 8/1995 |
| JP | 09-118755 A | 5/1997 |
| JP | 16-316850 | 11/2004 |
| JP | 2004-316850 A | 11/2004 |
| KR | 10-1996-0001537 | 1/1996 |
| KR | 10-1998-049479 A | 9/1998 |
| KR | 10-1999-0036405 | 5/1999 |
| KR | 10-2006-0051087 A | 5/2006 |
| KR | 10-2006-0051087 A | 5/2006 |
| WO | WO-97/38235 A1 | 10/1997 |
| WO | WO-98/50837 A1 | 11/1998 |
| WO | WO-2006092270 A1 | 9/2006 |

OTHER PUBLICATIONS

International Search Report and Written Opinion of related PCT/US08/54464, mailed Jun. 19, 2008.

International Search Report and Written Opinion dated Dec. 12, 2008 for PCT/US2008/073907.

International Search Report dated Aug. 6, 1998 for PCT/1998/009303.

International Search Report and Written Opinion of related PCT/US2008/054465 mailed Jun. 19, 2008.

Extended European Search Report dated Jul. 14, 2010, for EP 08798408.4.

PCT International Search Report dated Mar. 29, 2011, for PCT application No. PCT/US2010/043989.

Communication pursuant to Article 94(3) dated Aug. 24, 2011, for European Patent Application No. 08730296.4.

Extended European Search Report dated Dec. 27, 2010 for EP Application No. 08730296.4.

* cited by examiner

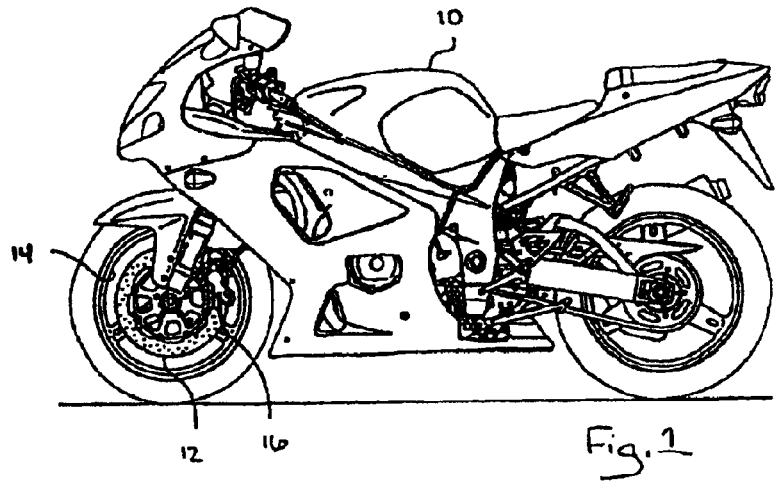
Fig. 1
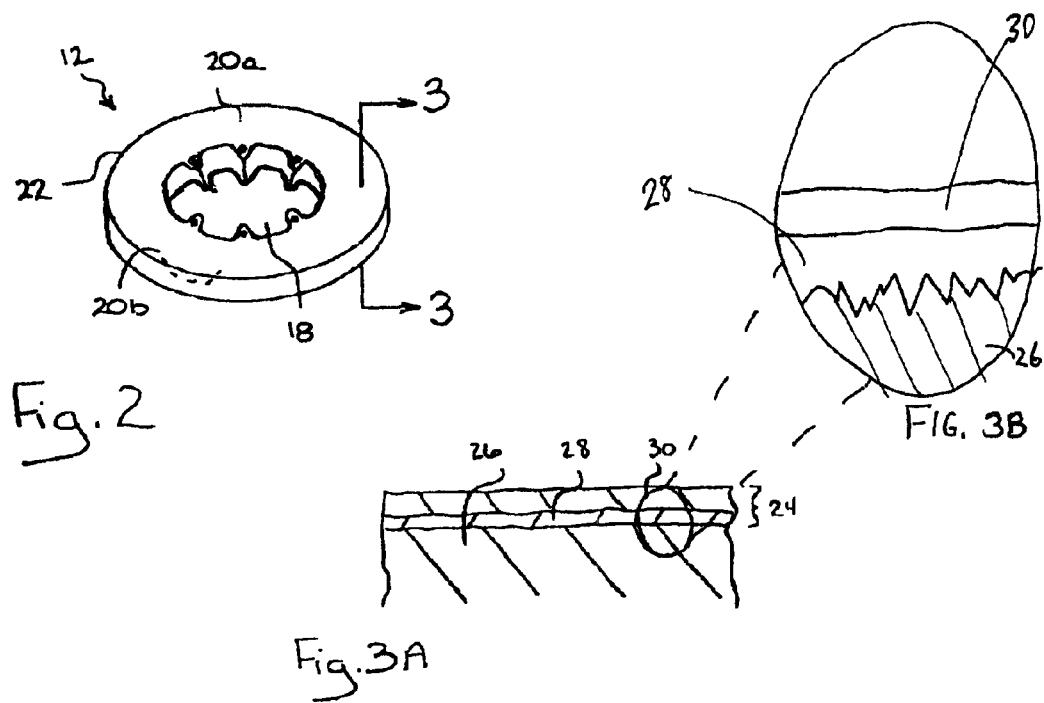
Fig. 2
Fig. 3A
FIG. 3B

WEAR RESISTANT COATING FOR BRAKE DISKS WITH UNIQUE SURFACE APPEARANCE AND METHOD FOR COATING

RELATED APPLICATION

This application claims the benefit of priority of U.S. Provisional Patent Application No. 60/890,790 filed Feb. 20, 2007 hereby incorporated by reference.

FIELD OF THE INVENTION

The present invention pertains generally to coated brake disks, drums or any mechanical device that uses friction to transfer kinetic energy, and methods for coating brake disks and drums. More particularly, the present invention pertains to brake disks and drums which have various surface finishes that when coated with a wear and corrosion resistant coating exhibit a three dimensional appearance or surface texture. The present invention is particularly, but not exclusively, useful as a brake disk for use on motorcycles, bicycles, automobiles and any other motor vehicle.

BACKGROUND

There are a number of reasons why it is important for a brake disk (also sometimes referred to as a brake rotor) to be wear and corrosion resistant while at the same time looking aesthetically pleasing. First, the ability of the brake disk to resist wear leads to a longer service life. A longer service life translates into reduced maintenance and the associated maintenance costs. Additionally, the ability of the brake disk to resist corrosion adds to the life and the overall appearance of the brake disk. Another consideration for brake disks used on motorcycles (or wherever the brake disk is exposed to general view), is the appearance of the brake disk.

During braking, hydraulic or mechanical energy is used to press the vehicle's brake pads against the rotating brake disk. The friction resulting from the moving contact between brake pad and brake disk slows the rotation of the brake disc and decreases the speed of the vehicle. This frictional contact generates heat and causes the contact surfaces on the brake pad and brake disk to wear unevenly. Excessive wear can cause the brake disk to become thin and weak. In some cases, the thinning of the brake disk becomes so severe that the brake disk is no longer able to support the stresses and heat generated during braking. The result is typically a warped brake disk that can cause undesirable brake chattering.

A final factor that must be considered when designing brake rotors is aesthetics. Modern motorcycles have rather large diameter brake disks that are plainly visible, especially the front disk. Because of this visibility, the color and surface appearance of a brake disk can add to or detract from the overall look of the motorcycle. These considerations can affect a purchaser's decision when buying a new motorcycle and when retrofitting a motorcycle with a new brake system.

In light of the above, it is an object of the present invention to provide cast iron, carbon steel, stainless steel, and light weight ceramic composite brake disks that are coated with a material that is wear and corrosion resistant.

SUMMARY

The present invention is directed to coated brake disks, brake drums or any mechanical device that uses friction to transfer kinetic energy, and methods for coating brake disks in order to exhibit a three dimensional appearance. For example, the three dimensional appearance or surface texture can be the appearance of a woven or a textured structure on the surface. The term brake disks is used throughout this document to represent brake disks, brake drums or any mechanical device that uses friction to transfer kinetic energy, for example, clutch assembly and fly wheels. In one embodiment a brake disk has one or more surface finishes or treatments done (generally referred to herein as surface finishing) to the parallel working surfaces which are in turn coated with a wear and corrosion resistant coating that exhibits a three dimensional surface appearance or surface texture which is aesthetically pleasing. In one embodiment at least a portion of the parallel surfaces of the brake disk substrate is surface finished to impart a predetermined surface irregularity, modification, design or defect that exhibit a three dimensional appearance or surface texture. In one embodiment the surface treatment includes a representation of a logo (for example, identifying a manufacturer) or artistic design. The surface irregularity or defect can be variations in the height of the parallel surfaces with angular or perpendicular surfaces between the variations in the height of the parallel surfaces. In addition the surface irregularity or modification can be formed as peaks, valleys and angular surfaces between the peaks and valleys. When the parallel surfaces of the disk brake are subsequently coated with a coating, the disk brake can exhibit a three dimensional appearance and/or texture. The surface finishing can be achieved, for example, by bead blasting, sanding, grinding, acid etching, photo-resist etching, roll forming, embossing, stamping, honing, lapping, polishing, blanching, milling, profiling.

In one embodiment the thickness of the coating material can vary between the peaks, valleys and angular surfaces to create the predetermined three dimensional appearance or surface texture. For example, more of the coating can be deposited on the peaks than is deposited on the angular surfaces. The coating material or recipe or construction of the coating can be selected to achieve the desired three dimensional appearance or surface texture. Further, the coating material can be selected to achieve different optical characteristics when applied to the parallel surfaces of the brake disk. The brake disk can be disk-shaped having a central hole (or in some cases multiple-holes) to allow the brake disk to be positioned over a hub. The brake disk is further formed with a pair of flat annular surfaces that extend from the central hole to the periphery of the brake disk. These flat surfaces are provided for contact with the brake pads during braking and constitute the wear surfaces for the brake disk.

In accordance with an embodiment, the brake disk can include a cast iron, carbon steel, light weight ceramic metallic composite, stainless steel or a light weight ceramic composite material. A portion of the brake disk, for example the wear or working surface, is first given a specific surface finish and then coated with a coating material that is wear and corrosion resistant. Further the coating material can be deposited on portions of the brake disk that will be visible when the brake disk is installed on the vehicle. In one embodiment, the coating is deposited on the entire brake disk.

In one embodiment, the combination of various surface finishes with the wear and corrosion resistant coating impart the three dimensional appearances to the coated brake disk. The three dimensional appearance or surface texture can be a woven or textured structure. In one embodiment the three dimensional appearance or surface texture can be accomplished by surface finishing at least a portion of the parallel surfaces of a brake disk substrate to impart variations in the height of the parallel surfaces to allow the parallel surfaces to trap particles of a coating material. The surface finish can be introduced to the brake disk surface by utilizing a variety of methods. These methods can be as simple as blasting the brake disk surface with a continuous stream of particles (commonly referred to as bead blasting) which are typically harder than the brake disk surface. These particles can be round in shape or very irregular in shape. The various particle shapes will impart a different surface finish or surface geography to the brake disk. For example, with the round particles (of various sizes) and appropriate particle energy (air pressure or hydro pressure) a surface texture that microscopically resembles low soft rolling hills can be achieved. With the irregular (crystalline) shaped particles a very coarse surface geometry (very rugged/jagged peaks and valleys) can be imparted to the brake disk surface. Other methods such as a sanded or a ground surface finish can be used to give a different appearance when coated with the wear and corrosion resistant coating. When the sanded or ground surface finish is done in a cross-hatched configuration and then coated with the wear and corrosion resistant coating the coated brake disk can exhibit a woven appearance or surface texture such as is found in components made from carbon fiber. In general, there is a multitude of surface finish techniques that can be utilized to impart a specific surface texture or geometry into the brake disk. The techniques for the surface finishing can include but are not limited to: bead blasting, sanding, grinding, acid etching, laser etching, photochemical etching, roll forming, embossing, stamping, honing, lapped, polished, blanched, milled, profiled or other additional machined surfaces and any combination(s) thereof. The surface finishing step can also include etching the surfaces of the brake disk substrate. This process can be used to dissolve unwanted materials such as metals or semiconductor materials.

In some embodiments, the coating includes a first layer of a material having either an amorphous structure (i.e. a non-crystalline structure) and/or a crystalline structure. In a one embodiment, the amorphous and/or crystalline material is a metal such as titanium, chromium, zirconium, hafnium, boron or an alloy thereof. The first layer is applied directly on the brake disk. The coating further includes a second layer that overlays and contacts the first layer. The second layer can include one or more metal nitrides, metal borides, metal carbides and metal oxides. The second layer can also include one or more nitrides, borides, carbides or oxides of the metal used in the first layer. For example, for a coating having titanium as the first layer, the second layer can be titanium nitride (TiN). Note; the abbreviations (e.g. TiN) are used herein as a shorthand rather than an exact chemical label, and do not suggest that the stoichiometry of the indicated compound must be exactly as stated in the abbreviation. Though the term layer is used herein when discussing the application or depositing of materials, the referred to layers can merge or intermingle such that no clear division exists between the layers.

The layers of the coating can be applied using a physical vapor deposition source such as a cathodic arc source with a controlled gas atmosphere. Other operable techniques such as unbalanced magnetron sputtering or thermal evaporation may also be used. During coating deposition, the brake disks are positioned on a fixture and the fixture is rotated in a planetary movement about a central axis. In greater detail, the fixture includes three or more parallel poles that are mounted on a plate and arranged wherein each pole is spaced at an equal distance from the other poles. A plurality of brake disks can be stacked on each pole, with spacers to separate adjacent disks within each stack. The poles are spaced from each other to allow the brake disks on one pole to overlap the brake disks on an adjacent pole. The spacers prevent brake disks on one pole from contacting the brake disks on an adjacent pole.

BRIEF DESCRIPTION OF THE DRAWINGS

The details of the present invention, both as to its structure and operation, may be gleaned in part by study of the accompanying drawings, in which like reference numerals refer to like parts, and in which:

FIG. 1 is a perspective view of a motorcycle having a disk brake system;

FIG. 2 is a perspective view of a coated disk brake;

FIG. 3A is an enlarged cross-sectional view of a portion of the coated disk brake shown in FIG. 2 as seen along line 3-3 in FIG. 2 showing the coating layers;

FIG. 3B is an enlarged portion of FIG. 3A.

DETAILED DESCRIPTION OF THE DRAWINGS

Figure 4:
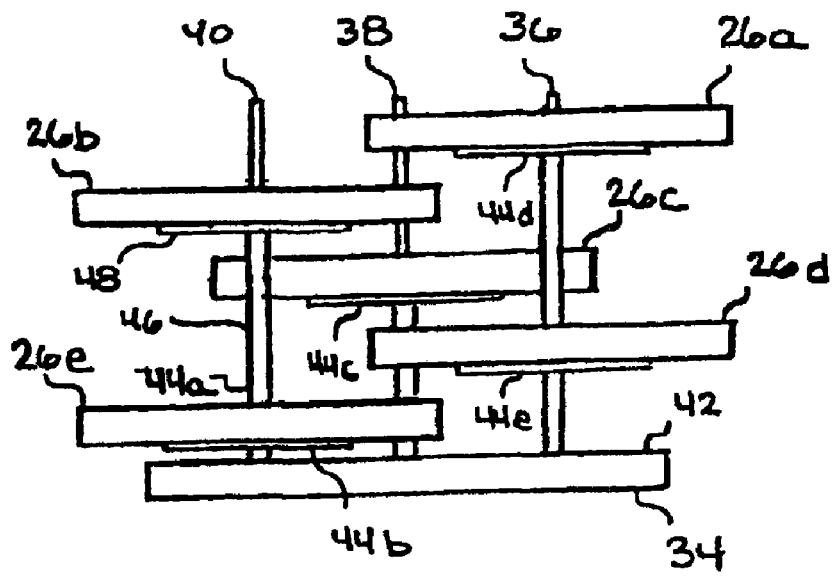
FIG. 4 is a front elevation view of a fixture for supporting the disk brakes during the coating process.

Referring to FIG. 1, motorcycle 10 is shown that includes a disk brake system. As shown, the disk brake system includes a brake disk 12 that is attached to the front wheel 14 of the motorcycle 10 for rotation therewith. The brake system further includes a caliper 16 having a pair of brake pads that can be selectively applied against the brake disk 12 using hydraulic pressure to slow the rotation of the brake disk 12 and wheel 14. In a typical setup, the hydraulic pressure is provided by the motorcycle operator using a hand lever mounted on the handlebars of the motorcycle 10. A similar system can be applied to the rear wheel of the motorcycle 10.

A better appreciation of a brake disk 12 can be obtained with reference to FIG. 2. As shown, the brake disk 12 is disk-shaped having a central hole 18 to allow the brake disk 12 to be positioned over the hub of the wheel 14 (shown in FIG. 1). The brake disk 12 is further formed with flat annular surfaces 20a,b (see also FIG. 4) that extend from the central hole 18 to the periphery 22 of the brake disk 12. As shown, flat surface 20a is parallel with and opposed to flat surface 20b on the brake disk 12. These flat surfaces 20a,b are provided for contact with the brake pads during braking and constitute the wear surfaces for the brake disk 12. In addition, it is flat surfaces 20a,b that receive the surface finish prior to coating with the wear and corrosion resistant coating. In one embodiment, the brake disk is surface finished to impart a three dimensional appearances to the brake disk before the brake disk is coated. The three dimensional appearance or surface texture can be a woven or textured structure. In one embodiment the three dimensional appearance or surface texture can be accomplished by surface finishing at least a portion of the parallel surfaces of a brake disk substrate to impart variations in the height of the parallel surfaces to allow the finished surfaces to receive varying amounts of the particles of a coating material. Methods for applying the coating materials are described below in more detail.

The surface finish can be introduced to the brake disk surface by utilizing a variety of methods. These methods can be as simple as blasting the brake disk surface with a continuous stream of particles (commonly referred to as bead blasting) which are typically harder than the brake disk surface. These particles can be round in shape or very irregular in shape. The various particle shapes will impart a different surface finish or surface geography to the brake disk. For example, with the round particles (of various sizes) and appropriate particle energy (air pressure or hydro pressure) a surface texture that microscopically resembles low soft rolling hills can be achieved. With the irregular (crystalline) shaped particles a very coarse surface geometry (very rugged/jagged peaks and valleys) can be imparted to the brake disk surface. Other methods such as a sanded or a ground surface finish can be used to give a different appearance when coated with the wear and corrosion resistant coating. When the sanded or ground surface finish is done in a cross-hatched configuration and then coated with the wear and corrosion resistant coating the coated brake disk can exhibit a woven appearance or surface texture such as is found in components made from carbon fiber. In general, there is a multitude of surface finish techniques that can be utilized to impart a specific surface texture or geometry into the brake disk. These techniques can include but are not limited to: bead blasting, sanding, grinding, acid etching, laser etching, photochemical etching, roll forming, embossing, stamping, honing, lapped, polished, blanched, milled, profiled or other additional machined surfaces and any combination(s) thereof. In one embodiment at least a portion of the parallel surfaces of the brake disk substrate is surface finished to impart a predetermined surface finish, irregularity, modification or defect that exhibits a three dimensional appearance or surface texture. The surface irregularity or defect can be variations in the height of the parallel. In addition the surface irregularity or modification can be formed as peaks, valleys and angular surfaces on the parallel surfaces of the brake disk. When the parallel surfaces of the disk brake is subsequently coated with a coating (as described below), the disk brake exhibits a three dimensional appearance or surface texture. The surface texture can be enhanced by controlling the depositing of the coating, for example, by depositing more of the material on the peaks and less of the material on the angular surfaces. This can enhance the resulting surface texture. Additionally, the coating can be selected such that a desired absorption or reflection of light is achieved. In addition the composition and thickness of the coating material to achieve a desired light reflection and absorption according to a specific wavelength. Further, the surface texture can include a representation of a logo or artistic design.

Referring now to FIG. 3A, a coating 24 is shown applied to a brake disk substrate 26. For the brake disk 12, the brake disk substrate 26 can be made of a cast iron, stainless steel or light weight ceramic composite materials. As further shown in FIG. 3A, the coating 24 can include a first layer 28 of a material having an amorphous structure (i.e. a non-crystalline structure) or a crystalline structure. The first layer 28 can include multiple layers or multiple surfaces that can be merged to form a single layer. The thickness of each layer can vary from one or a few atoms in depth to thousands of Angstroms. The surface irregularity or defect can be variations in the height of the parallel surfaces and angled surfaces between the variations in height illustrated in FIG. 3B. In addition the surface irregularity or modification can be formed as peaks, valleys and angular surfaces between the peaks and valleys. When the parallel surfaces of the disk brake is subsequently coated with a coating the disk brake can exhibit a three dimensional appearance or surface texture In addition the composition and thickness of the coating material can be selected to achieve a desired light reflection and absorption. In some embodiments, the amorphous or crystalline material is a metal such as titanium, chromium, zirconium, boron, hafnium or an alloy thereof.

Continuing with FIG. 3A, the coating 24 can also include a second layer 30 that overlays and contacts the first layer 28. Though the layers are depicted as distinct, in some embodiments, the layers intermingle or merge such that no distinct boundary exists between the layers. The second layer 30 can include one or more binary metals, for example, one or more metal nitrides, metal borides, metal carbides and metal oxides. The second layer can include one or more nitrides, borides, carbides or oxides of the metal used in the first layer. In some embodiments of a coating 24, amorphous titanium constitutes the first layer 28 and a titanium nitride (TiN, $Ti_2N$, etc.) constitutes the second layer 30. The multiple layers, for example layers 28 and 30 can be configured to form a lattice structure or a super lattice structure. These are thin films formed by alternately depositing two different components to form layered structures. Multilayers become superlatices when the period of the different layers is less than 100 Å. With this cooperation of structure, a coating 24 having a service life to exceed approximately 100,000 vehicle miles or more can be obtained. Note: the abbreviations (e.g. TiN, $Ti_2N$, etc.) are used herein as a shorthand rather than an exact chemical label, and do not suggest that the stoichiometry of the indicated compound must be exactly as stated in the abbreviation.

Referring now with cross-reference to FIGS. 4 and 5, an example apparatus for forming the coatings will be described. A fixture 34 is shown for holding the brake disk substrates 26 during coating. Although the fixture 34 is shown holding five brake disk substrates 26a-e, it is to be appreciated that the fixture 34 is merely exemplary and that fewer or more brake disk substrates 26 could be positioned on a fixture 34. As shown, the fixture 34 includes three parallel poles 36, 38, 40 that are mounted on and extend from a base plate 42. Although the fixture 34 only shows three parallel poles 36, 38, 40 it is appreciated that this configuration is only exemplary and that fewer or more parallel poles could be positioned on the fixture 34. The parallel poles 36, 38, 40 are arranged on the base plate 42 with each pole 36, 38, 40 spaced at an equal distance from the other two poles 36, 38, 40. With this cooperation of structure, a plurality of brake disk substrates 26 can be stacked on each pole 36, 38, 40. For example, as shown, brake disk substrates 26a and 26d are stacked on pole 36, brake disk substrate 26c is stacked pole 38 and brake disk substrates 26b and 26e are stacked on pole 40.

Figure 5:
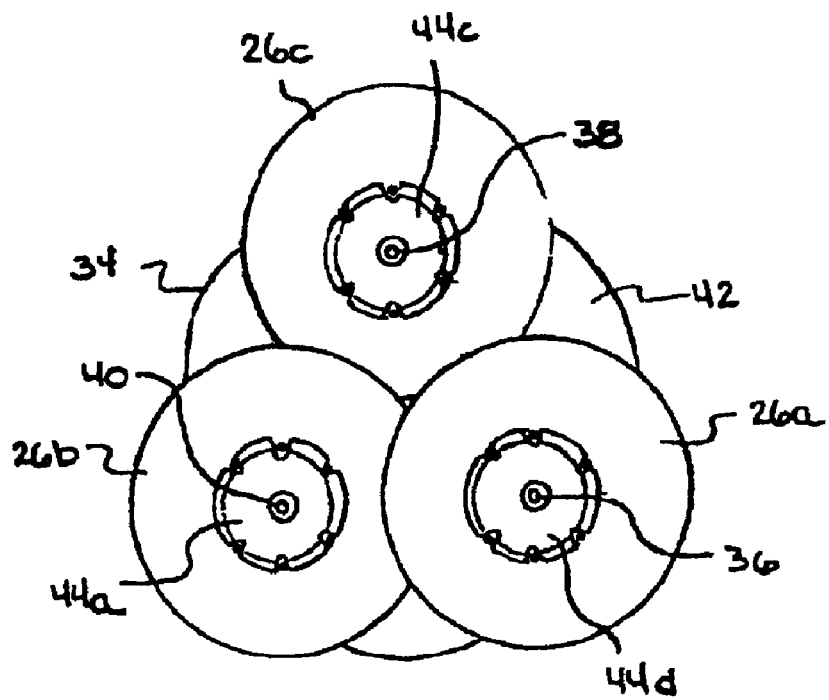
FIG. 5 is a top plan view of a fixture for supporting the disk brakes during the coating process.

Continuing with cross-reference to FIGS. 4 and 5, it can be seen that spacers 44a-e can be used to selectively separate adjacent brake disk substrates 26 on each pole 36, 38, 40. For the implementation shown, each spacer 44a-e includes a tube 46 and flange 48 allowing each spacer 44a-e to be slid over a respective pole 36, 38, 40 and positioned as desired. In the implementation shown in FIGS. 4 and 5, the spacing between poles 36, 38 is established to allow the brake disk substrates 26 on one pole 36, 38, 40 to overlap the brake disk substrates 26 on an adjacent pole 36, 38, 40. Also for the implementation shown in FIGS. 4 and 5, the spacers 44a-e have been sized to prevent brake disk substrates 26 on one pole 36, 38, 40 from contacting the brake disk substrates 26 on an adjacent pole 36, 38, 40.

Figure 6:
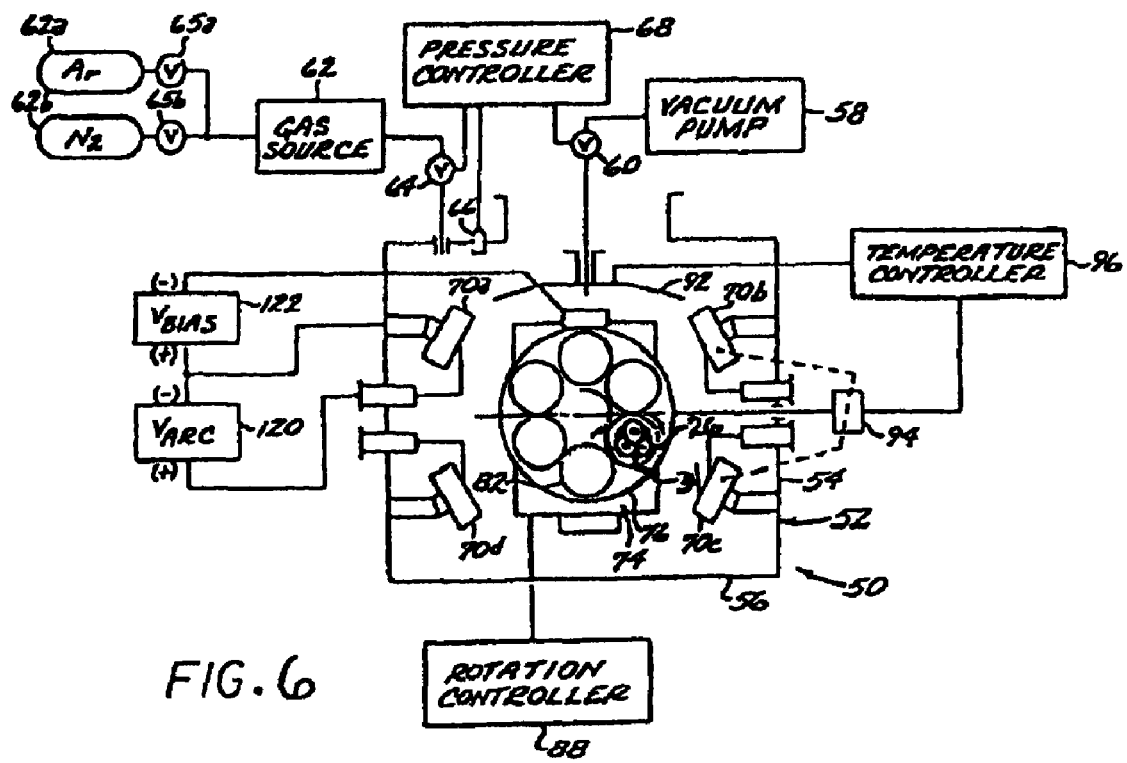
FIG. 6 is a schematic plan view and control diagram of a deposition apparatus for use in the invention.
Figure 7:
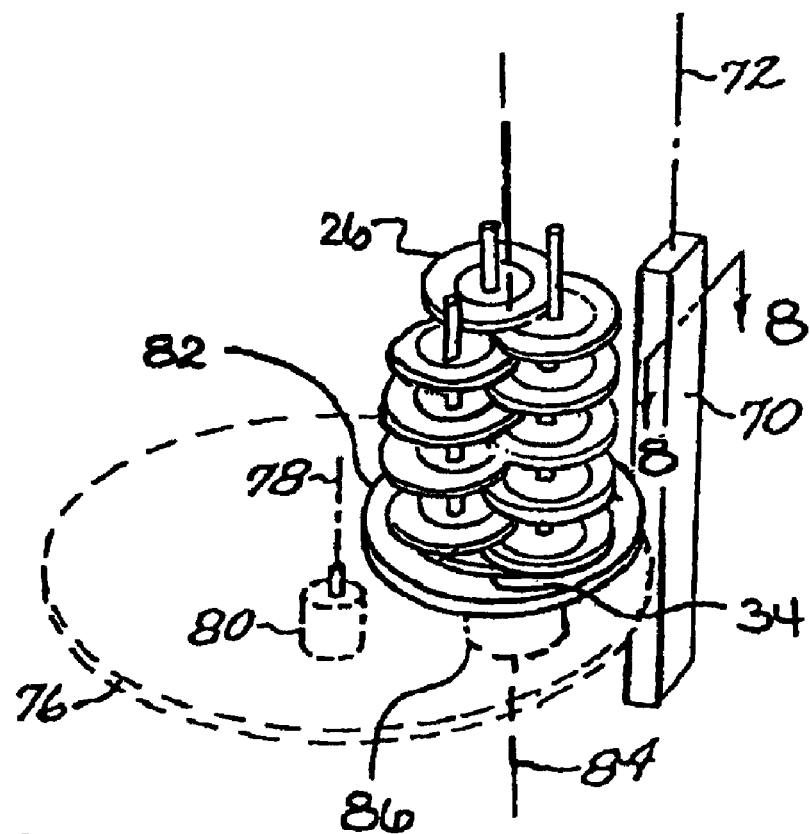
FIG. 7 is a schematic perspective view of a detail of the deposition apparatus of FIG. 5.

FIGS. 6 and 7 depict an example of a deposition apparatus 50 for coating the brake disk substrates 26, although other operable deposition apparatus may be used. The deposition apparatus 50 includes a chamber 52 having a body 54 and a door 56 that may be opened for access to the interior of the chamber 52 and which is hermetically sealed to the body 54 when the chamber 52 is in operation. The interior of the chamber 52 is controllably evacuated by a vacuum pump 58 pumping through a gate valve 60. The vacuum pump 58 includes a mechanical pump and a diffusion pump operating together in the usual manner. The interior of the chamber 52 may be controllably backfilled to a partial pressure of a selected gas from a gas source 62 through a backfill valve 64. The gas source 62 typically includes several separately operable gas sources. The gas source 62 usually includes a source 62a of an inert gas such as argon and a source 62b of Nitrogen gas, each providing gas selectively and independently through a respective selector valve 65a or 65b. Other types of gas can also be provided as desired, such as gases required to produce borides, oxides and/or carbides.

The pressure within the chamber 52 is monitored by a vacuum gage 66, whose output signal is provided to a pressure controller 68. The pressure controller 68 controls the settings of the gate valve 60 and the backfill valve 64 (and, optionally, the selector valves 65), achieving a balance of pumping and backfill gas flow that produces a desired pressure in the chamber 52 and thence pressure reading in the vacuum gauge 66. Thus, the gaseous backfilled atmosphere within the chamber 52 can be a flowing or dynamic atmosphere.

At least two linear deposition sources 70 are mounted within the interior of the chamber 52 in a circumferentially spaced-apart manner. In FIG. 6, the four deposition sources are identified as distinct sources 70a, 70b, 70c, and 70d, as they will be addressed individually in the subsequent discussion. The four deposition sources 70 are generally rectangular bodies having a greatest rectilinear dimension elongated parallel to a source axis 72. This type of deposition source is distinct from either a stationary point source or a point source that moves along the length of the substrate 26 during deposition procedures.

A support 74 is positioned in the chamber 52. The support 74 produces a compound rotational movement of a fixture 34 mounted thereon. The support 74 can include a rotational carriage 76 that rotates about an axis 78, driven by a rotational drive motor 80 below the rotational carriage 76. Mounted on the rotational carriage 76 are at least one, for example six as shown, planetary carriages 82. The planetary carriages 82 are rotationally driven about a rotational axis 84 by a planetary drive motor 86 below the planetary carriages 82. The speeds of the rotational drive motor 80 and the planetary drive motor 86 are controlled by a rotation controller 88. The rotation controller 88 can rotate the rotational carriage 76 at a rate of about 1 revolution per minute (rpm).

Continuing with FIGS. 6 and 7, for deposition processing of brake disk substrates 26, a fixture 34 as described above can be mounted on the planetary carriage 82, as shown. For commercial operations, a fixture 34 having a plurality of brake disk substrates 26 is typically mounted on each planetary carriage 82 in the manner described, as illustrated for one of the planetary carriages 82 in FIG. 6.

The temperature in the chamber 52 during deposition is controlled using a heater 92 that extends parallel to the deposition sources 70 on one side of the interior of the chamber 52. The heater 92 can be a radiant heater operating with electrical resistance elements. The temperature of the heating array is monitored by a temperature sensor 94 such as an infrared sensor that views the interior of the chamber 52. The temperature measured by the sensor 94 is provided to a temperature control circuit 96 that provides the power output to the heater 92. Acting in this feedback manner, the temperature controller 96 allows the temperature of the heating array to be set. In the processing phase, the heating array can be heated to a temperature of from about 1000.degree. F. to about 1700.degree. F.

Figure 8:
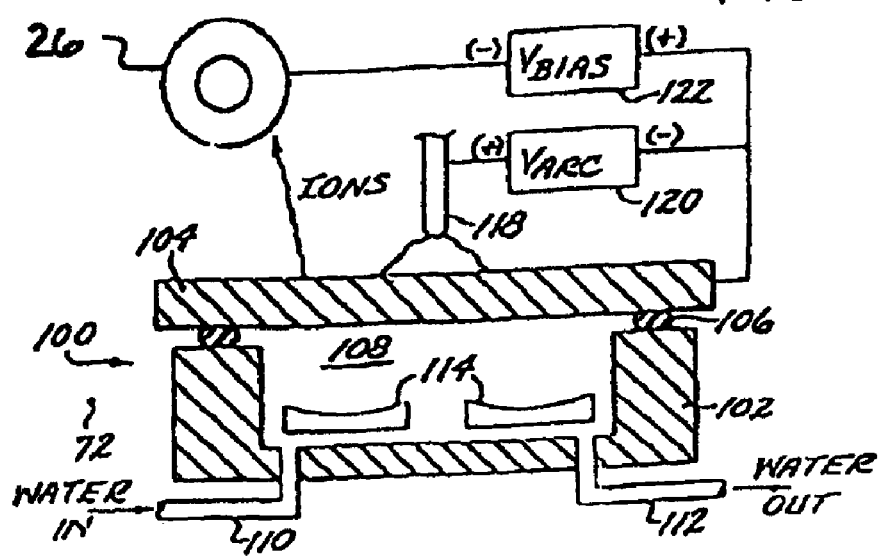
FIG. 8 is a schematic cross-sectional view of a cathodic arc source, taken along lines 8-8 of FIG. 7.

FIG. 8 illustrates a cathodic arc source 100 that can be used in the deposition source 70. The cathodic arc source 100 includes a channel-shaped body 102 and a deposition target 104. The deposition target 104 is in the form of a plate that is hermetically sealed to the body 102 using an O-ring 106, forming a water-tight and gas-tight hollow interior 108. The interior 108 is cooled with cooling water flowing through a water inlet 110 and a water outlet 112. Two spirally shaped (only sections of the spirals are seen in FIG. 8) permanent magnets 114 extend parallel to the source axis 72. Positioned above the deposition target 104 exterior to the body 102 is a striker electrode 118. A voltage $V_{ARC}$ is applied between the striker electrode 118 and the deposition target 104 by an arc source power supply 120. $V_{ARC}$ can range from about 10 to about 50 volts.

The metallic material that forms the deposition target 104 is deposited onto the brake disk substrate 26 together with, if desired, gas atoms producing gaseous species from the atmosphere of the chamber 52. For the embodiment describe herein, the deposition target 104 is made of Titanium (Ti) metal.

To accomplish the deposition, an arc is struck between the striker electrode 118 and the deposition target 104, locally heating the deposition target 104 and causing Titanium atoms and/or ions to be ejected from the deposition target 104. (The deposition target 104 is therefore gradually thinned as the deposition proceeds.) The striking point of the arc on the deposition target 104 moves in a racetrack course along the length of the deposition target 104. A negative bias voltage $V_{BIAS}$ is applied between the deposition target 104 and brake disk substrate 26 by a bias power supply 122, so that any positively charged ions are accelerated toward the brake disk substrate 26.

$V_{BIAS}$ can range from about −20 to about −1000 volts. The value selected for $V_{BIAS}$ determines the energy of ionic impact against the surface of the substrates, a phenomenon termed ion peening. In a typical case, $V_{BIAS}$ is initially selected to be a relatively large negative voltage to achieve good adherence of the metallic first layer 28 (see FIG. 3A) to the brake disk substrate 26. $V_{BIAS}$ is subsequently reduced (made less negative) when the overlying hard layer is deposited, to achieve a uniform, fine microstructure in the overlying layer. The values of $V_{BIAS}$ are desirably maintained as low as possible, consistent with obtaining an adherent coating 24. $V_{BIAS}$ is more positive than −600 volts, for example −400 volts and more. If $V_{BIAS}$ is too negative, corona effects and back sputtering may occur at some regions of the brake disk substrate 26. Thus, while higher $V_{BIAS}$ voltages may be used in some instances, generally $V_{BIAS}$ can be more positive than −600 volts. The cathodic arc source 100 and other types of sources, such as sputtering sources, may also be used.

The cooperative selection of the material of the deposition target 104 and the gases introduced into the deposition chamber 52 from the gas source 62 allows a variety of coatings 24 to be deposited onto the brake disk substrate 26, within the constraints discussed previously. The total thickness of the coating 24 can range from about 0.5 to about 50.0 microns. If the coating thickness is less than about 1 micrometer, the physical properties of the coating 24 are insufficient to produce the desired results. If the coating thickness is more than about 10 micrometers, the coating 24 has a high internal stress that leads to a tendency for the coating 24 to crack and spall away from the brake disk substrate 26 during deposition or during service.

These general principles are applied in preparing the coatings 24 of interest, as described previously in relation to FIG. 3A. The coating 24 of FIG. 3A includes an amorphous metallic first layer 28, such as amorphous metallic Titanium, that contacts and overlays the surface of the brake disk substrate

26. The amorphous metallic first layer 28 is deposited by backfilling the deposition chamber 52 with a small partial pressure of about 5 microns of an inert gas, such as flowing argon (flowing at a rate of about 200-450 standard cubic centimeters per minute (sccm) in the apparatus used by the inventors), and then depositing metal, such as Titanium, from the deposition target 104 with $V_{BIAS}$ about −400 volts. Because the argon does not chemically react with the metal, an amorphous metallic first layer 28 is deposited.

As shown in FIG. 3A, a second layer 30, which for the embodiment described herein is a metal Nitride, overlies the amorphous metallic first layer 28. The second layer 30 is deposited by backfilling the deposition chamber 52 with a small partial pressure of about 5 microns of flowing Nitrogen (flowing at a rate of about 150-500 seen in the inventors' apparatus), and then depositing metal, such as Titanium, from the deposition target 104 with $V_{BIAS}$ about −50 v While the particular brake disks and drums, surface finishes and methods for coating as herein shown and disclosed in detail are fully capable of obtaining the objects and providing the advantages herein before stated, it is to be understood that they are merely illustrative. The described systems and methods can also be applied to other systems such as clutch plates, clutches and flywheels. No limitations are intended to the details of construction or design herein shown other than as described in the appended claims.

The invention claimed is:

1. A method comprising:
   surface finishing at least a portion of two parallel surfaces of a brake disk to impart a predetermined three dimensional surface texture having peaks, valleys and angular surfaces between the peaks and valleys to at least the portion of the two parallel surfaces;
   applying a first material to an area comprising at least the portion of the parallel surfaces through vapor deposition, wherein the first material is deposited onto the area by energizing a first material source to cause charged particles of the first material source to be dissociated from the first material source and deposited on the area; and
   applying a second compound to the area through vapor deposition, the applying comprising energizing a second material source to cause charged particles of the second material source to be dissociated from the second material source, and reacting a reactive gas with the charged particles of the second material to form the second compound applied to the area;
   wherein the combination of the surface finishing and the applying of the first material and the second compound causes the area of the brake disk to exhibit the predetermined three dimensional surface texture after applying the first material and the second compound.

2. The method of claim 1, wherein the first material is a metal with an amorphous structure.

3. The method of claim 1, wherein the first material is a metal with a crystalline structure.

4. The method of claim 1, wherein the second material is a binary metal.

5. The method of claim 4, wherein the binary metal is selected from the group consisting of a metal nitride, a metal oxide, a metal boride and a metal carbide.

6. The method of claim 1, wherein the three dimensional surface texture is selected from the group consisting of a woven structure and a textured structure.

7. The method of claim 1, wherein the surfacing finishing comprises at least one of bead blasting, sanding, grinding, acid etching, photo-resist etching, roll forming, embossing, stamping, honing, lapping, polishing, blanching, milling, and profiling.

8. The method of claim 1, wherein the applying a first material comprises:
   engaging the parallel surfaces of the brake disk with a fixture of a deposition apparatus comprising at least two linear deposition sources with each of the deposition sources lying parallel to an axis and each of the deposition sources being a source of the first material; and
   rotating the fixture in a planetary movement about the axis and operating the deposition sources to deposit the first material to the parallel surfaces of the brake disk.

9. The method of claim 8, wherein each of the linear deposition sources is selected from the group consisting of a cathodic arc source, a magnetron sputtering source and an evaporative source.

10. The method of claim 1 wherein the first material source and the second material source are the same material.

11. The method of claim 1, wherein a total thickness of a coating on the brake disk comprising the first material and at least the second compound is in a range of 0.5 to 50 μm.

12. The method of claim 1, wherein the applying of at least one of the first material and the second compound is performed in a deposition chamber comprising a heating array heated to a temperature in a range of approximately 1000° F. to 1700° F.

13. A method for manufacturing a coated brake disk having parallel surfaces comprising:
   surface finishing a portion of the parallel surfaces of a brake disk to impart a predetermined three dimensional pattern to the portion of the parallel surfaces of the disk brake, the three dimensional pattern including peaks, valleys and angular surfaces between the peaks and valleys;
   applying at least a first layer of coating to the portion of the parallel surfaces of the brake disk with at least a first coating material through vapor deposition; and
   applying at least a second layer of coating to the portion of the parallel surfaces of the brake disk with at least a second coating material through vapor deposition wherein more of the second layer of coating is deposited on the peaks than is deposited on the angular surfaces between the peaks and valleys;
   wherein the outermost layer of the parallel surfaces of the brake disk maintains the predetermined three dimensional appearance after depositing the at least first and at least second layers.

14. A method for manufacturing a coated brake disk having parallel surfaces comprising:
   surface finishing at least a portion of the parallel surfaces of a brake disk to impart a predetermined three dimensional surface texture having peaks, valleys, and angular surfaces between the peaks and valleys;
   applying a first material to the at least a portion of the parallel surfaces of the brake disk through vapor deposition; and
   applying at least a second material to the at least a portion of the parallel surfaces of the brake disk through vapor deposition, wherein more of the second layer of coating is deposited on the peaks than is deposited on the angular surfaces between the peaks and valleys;
   wherein the combination of the surface finishing and the application of the first and second materials causes the at least the portion of the parallel surfaces of the brake disk to exhibit the predetermined three dimensional surface texture after the applying of the first material and the applying of at least the second material.

15. The method of claim 14, wherein the surfacing finishing comprises at least one of bead blasting, sanding, grinding, acid etching, photo-resist etching, roll forming, embossing, stamping, honing, lapping, polishing, blanching, milling, and profiling.

16. The method of claim 14, wherein the brake disk comprises a third material selected from cast iron, carbon steel, light weight ceramic metallic composite, stainless steel, and a light weight ceramic composite material.

17. The method of claim 14, wherein the applying of the first material and at least the second material comprises depositing more of the first material and at least the second material on the peaks and less of the first material and at least the second material on the angular surfaces.

18. The method of claim 14, further comprising selecting at least one of the first material and the second material to achieve a desired absorption or reflection of light from the coated brake disk.

19. The method of claim 14, further comprising selecting a composition and a thickness of at least one of the first material and the second material to achieve a desired light reflection and absorption from the coated brake disk at a specific wavelength.

20. A brake disk comprising:
a portion of parallel surfaces of the brake disk comprising a predetermined three dimensional pattern imparted thereupon by surface finishing, the three dimensional pattern including peaks, valleys and angular surfaces between the peaks and valleys;
a first material applied to the portion of the parallel surfaces of the brake disk through vapor deposition;
a second material applied to the portion of the parallel surfaces of the brake disk through vapor deposition, wherein more of the second material is deposited on the peaks than is deposited on the angular surfaces between the peaks and valleys; and
wherein the combination of the surface finishing and the application of the first and second materials causes the at least a portion of the parallel surfaces of the brake disk to exhibit the predetermined three dimensional appearance after depositing of the first material and the second material.

21. The brake disk of claim 20, wherein the first material is a metal with an amorphous structure.

22. The brake disk of claim 20, wherein the first material is a metal with a crystalline structure.

23. The brake disk of claim 20, wherein the second material is a binary metal.

24. The brake disk of claim 23, wherein the binary metal is selected from the group consisting of a metal nitride, a metal oxide, a metal boride and a metal carbide.

25. The brake disk of claim 20, wherein the three dimensional surface texture is selected from the group consisting of a woven structure and a textured structure.

26. The brake disk of claim 20, wherein the surfacing finishing comprises at least one of bead blasting, sanding, grinding, acid etching, photo-resist etching, roll forming, embossing, stamping, honing, lapping, polishing, blanching, milling, and profiling.

* * * * *